(12) United States Patent
Byun et al.

(10) Patent No.: US 11,917,855 B2
(45) Date of Patent: Feb. 27, 2024

(54) DISPLAY DEVICE

(71) Applicant: Samsung Display Co., LTD., Yongin-si (KR)

(72) Inventors: Jin-Su Byun, Seoul (KR); Jong Beom Hong, Yongin-si (KR); Woong Sik Kim, Hwaseong-si (KR); Jung Min Choi, Hwaseong-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 0 days.

(21) Appl. No.: 17/592,498

(22) Filed: Feb. 3, 2022

(65) Prior Publication Data

US 2022/0416212 A1    Dec. 29, 2022

(30) Foreign Application Priority Data

Jun. 29, 2021 (KR) ........................ 10-2021-0084534

(51) Int. Cl.
*G06F 3/041* (2006.01)
*H10K 50/858* (2023.01)
*G06F 3/044* (2006.01)
*H10K 50/844* (2023.01)
*H10K 59/40* (2023.01)
*H10K 59/122* (2023.01)

(52) U.S. Cl.
CPC ......... *H10K 50/858* (2023.02); *G06F 3/0412* (2013.01); *G06F 3/0446* (2019.05); *H10K 50/844* (2023.02); *H10K 59/122* (2023.02); *H10K 59/40* (2023.02); *G06F 2203/04112* (2013.01)

(58) Field of Classification Search
CPC .............. H01L 51/5275; H01L 27/323; H01L 27/3246; G06F 3/0446; G06F 3/0412
See application file for complete search history.

(56) References Cited

U.S. PATENT DOCUMENTS

| 2018/0138458 A1* | 5/2018 | Tokuda ................. H01L 51/524 |
| 2019/0165061 A1 | 5/2019 | Jung et al. |

FOREIGN PATENT DOCUMENTS

| KR | 1020190062678 | 6/2019 |
| KR | 1020200071190 | 6/2020 |

(Continued)

*Primary Examiner* — Dennis P Joseph
(74) *Attorney, Agent, or Firm* — CANTOR COLBURN LLP

(57) ABSTRACT

A display device includes a substrate, a transistor on the substrate, a pixel electrode connected to the transistor, a bank layer disposed on the pixel electrode and defining a pixel opening overlapping the pixel electrode, an emission layer in the pixel opening, a common electrode on the emission layer and the bank layer, an encapsulation layer on the common electrode, a sensing electrode on the encapsulation layer, a first insulating layer disposed on the encapsulation layer and overlapping the pixel opening, a second insulating layer on the first insulating layer, and a third insulating layer surrounding the first insulating layer. A refractive index of the first insulating layer, a refractive index of the second insulating layer, and a refractive index of the third insulating layer are different from one another, and the refractive index of the first insulating layer is greater than the refractive index of the third insulating layer.

19 Claims, 12 Drawing Sheets

(56) References Cited

FOREIGN PATENT DOCUMENTS

| KR | 1020200085968 | 7/2020 |
|----|---------------|--------|
| KR | 1020200127103 | 11/2020 |
| KR | 1020200141553 | 12/2020 |

* cited by examiner

DISPLAY DEVICE

This application claims priority to Korean Patent Application No. 10-2021-0084534, filed on Jun. 29, 2021, and all the benefits accruing therefrom under 35 U. S. C. § 119, the content of which in its entirety is herein incorporated by reference.

BACKGROUND

1. Field

Embodiments of the invention relate to a display device.

2. Description of the Related Art

A display device displays images on a screen, and may include various types such as a liquid crystal display ("LCD") and an organic light-emitting diode display ("OLED"). The display device is used in various electronic devices such as portable phones, GPS, digital cameras, electronic books, portable game devices, or various terminals.

The display device has a multilayered structure. The display device may be configured with a multilayered structure in which a light-emitting device and a touch sensor are stacked on a substrate, for example. An image may be displayed when light generated by the light-emitting device passes through the layers and is discharged outside the display device.

SUMMARY

Some of light generated by a light-emitting device is reflected on an interlayer interface, so it may not be discharged to the outside but may become extinct. By this, light outputting efficiency and displaying quality at the front of the display device are deteriorated.

The described technology has been made in an effort to provide a display device for improving light-outputting efficiency and displaying quality.

An embodiment provides a display device including a substrate, a transistor disposed on the substrate, a pixel electrode connected to the transistor, a bank layer disposed on the pixel electrode and defining a pixel opening overlapping the pixel electrode, an emission layer disposed in the pixel opening, a common electrode disposed on the emission layer and the bank layer, an encapsulation layer disposed on the common electrode, a sensing electrode disposed on the encapsulation layer, a first insulating layer disposed on the encapsulation layer and overlapping the pixel opening, a second insulating layer disposed on the first insulating layer, and a third insulating layer surrounding the first insulating layer, where a refractive index of the first insulating layer, a refractive index of the second insulating layer, and a refractive index of the third insulating layer are different from one another, and the refractive index of the first insulating layer is greater than the refractive index of the third insulating layer.

In an embodiment, the refractive index of the second insulating layer may be less than the refractive index of the first insulating layer and may be greater than the refractive index of the third insulating layer.

In an embodiment, an opening may be defined in the third insulating layer, the first insulating layer may be disposed in the opening of the third insulating layer, and the second insulating layer may cover the first insulating layer and the third insulating layer.

In an embodiment, a thickness of the third insulating layer may be greater than a thickness of the first insulating layer.

In an embodiment, a width of the opening of the third insulating layer may correspond to a width of the first insulating layer, and an end portion of the first insulating layer may contact an end portion of the third insulating layer.

In an embodiment, a width of the opening of the third insulating layer may be greater than a width of the first insulating layer, and the first insulating layer may be spaced apart from the third insulating layer.

In an embodiment, a width of the opening of the third insulating layer may be greater than a width of the first insulating layer, and the third insulating layer may cover a lateral side of the first insulating layer.

In an embodiment, the sensing electrode may be covered by the third insulating layer.

In an embodiment, the display device may further include a sensing electrode connector connected to the sensing electrode, and a sensing insulating layer disposed between the sensing electrode and the sensing electrode connector.

In an embodiment, the sensing electrode may be disposed on the third insulating layer.

In an embodiment, the display device may further include a sensing electrode connector connected to the sensing electrode, where the third insulating layer may be disposed between the sensing electrode and the sensing electrode connector.

In an embodiment, the second insulating layer may cover the first insulating layer, and the third insulating layer may cover the second insulating layer.

In an embodiment, the second insulating layer may cover an upper side and a lateral side of the first insulating layer, and the third insulating layer may cover an upper side and a lateral side of the second insulating layer.

In an embodiment, a width of the second insulating layer may be greater than a width of the first insulating layer, and the third insulating layer may be disposed on an entirety of the substrate.

In an embodiment, a thickness of the second insulating layer may be greater than a thickness of the first insulating layer, and a thickness of the third insulating layer may be greater than the thickness of the second insulating layer.

In an embodiment, the display device may further include a sensing electrode connector connected to the sensing electrode, and a sensing insulating layer disposed between the sensing electrode and the sensing electrode connector, where the first insulating layer is disposed on the sensing insulating layer.

In an embodiment, the display device may further include a sensing electrode connector connected to the sensing electrode, and a sensing insulating layer disposed between the sensing electrode and the sensing electrode connector, where the first insulating layer is disposed on the sensing insulating layer.

In an embodiment, the display device may further include a sensing electrode connector connected to the sensing electrode, and a sensing insulating layer disposed between the sensing electrode and the sensing electrode connector, where the first insulating layer includes a same material as a material of the sensing insulating layer and is disposed in a same layer.

In an embodiment, a difference between a refractive index of the first insulating layer and a refractive index of the second insulating layer may be equal to or greater than about 0.01 and may be equal to or less than about 0.67.

In an embodiment, a difference between a refractive index of the second insulating layer and a refractive index of the third insulating layer may be equal to or greater than about 0.01 and may be equal to or less than about 0.67.

In an embodiment, the difference between the refractive index of the first insulating layer and the refractive index of the second insulating layer may be equal to or greater than about 0.05, and the difference between the refractive index of the second insulating layer and the refractive index of the third insulating layer may be equal to or greater than about 0.05.

By the embodiments, the light-outputting efficiency and displaying quality of the display device may be improved.

BRIEF DESCRIPTION OF THE DRAWINGS

The above and other exemplary embodiments, advantages and features of this disclosure will become more apparent by describing in further detail exemplary embodiments thereof with reference to the accompanying drawings, in which.

DETAILED DESCRIPTION

Figure 1:
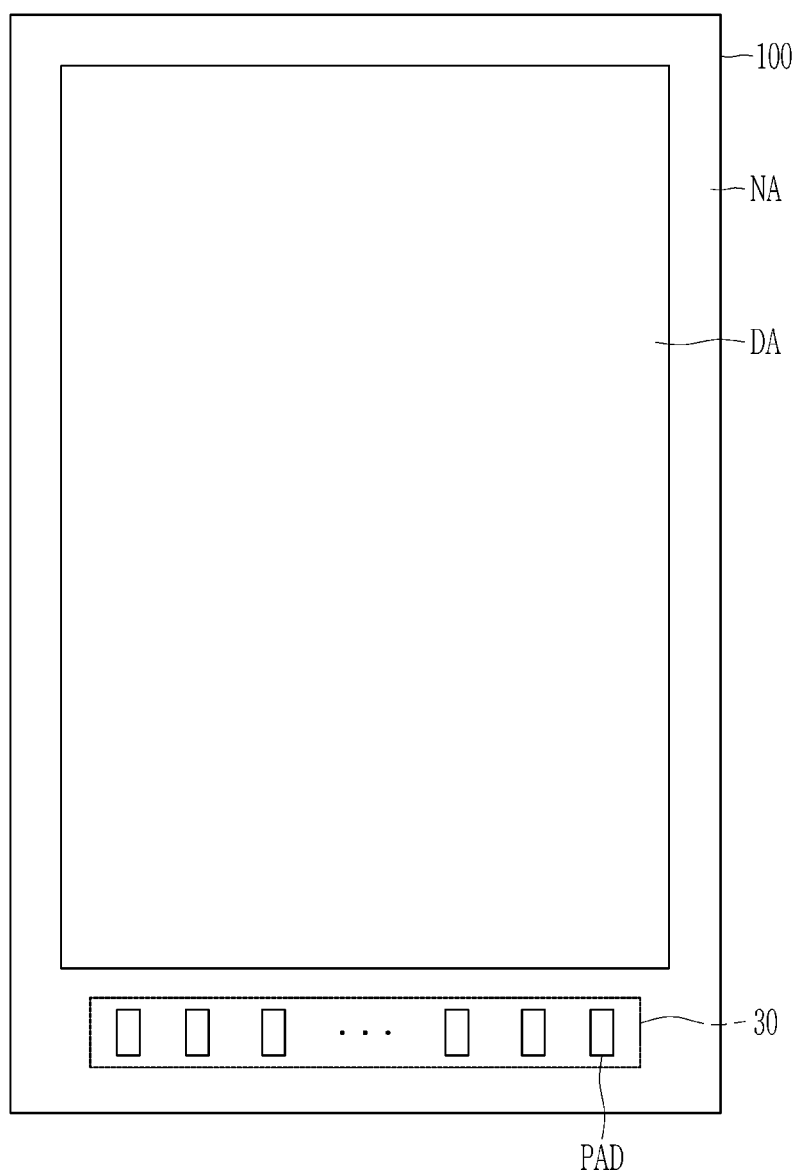
FIG. 1 shows a top plan view of an embodiment of a display device.

Embodiments of the invention will be described more fully hereinafter with reference to the accompanying drawings, in which embodiments of the invention are shown. As those skilled in the art would realize, the described embodiments may be modified in various different ways, all without departing from the spirit or scope of the invention.

Parts that are irrelevant to the description will be omitted to clearly describe the invention, and the same elements will be designated by the same reference numerals throughout the specification.

The size and thickness of each configuration shown in the drawings are arbitrarily shown for better understanding and ease of description, but the invention is not limited thereto. In the drawings, the thickness of layers, films, panels, regions, etc., are enlarged for clarity. The thicknesses of some layers and areas are exaggerated for convenience of explanation.

It will be understood that when an element such as a layer, film, region, or substrate is referred to as being "on" another element, it can be directly on the other element or intervening elements may also be present. In contrast, when an element is referred to as being "directly on" another element, there are no intervening elements present. The word "on" or "above" means positioned on or below the object portion, and does not necessarily mean positioned on the upper side of the object portion based on a gravitational direction.

Unless explicitly described to the contrary, the word "comprise", and variations such as "comprises" or "comprising" will be understood to imply the inclusion of stated elements but not the exclusion of any other elements.

The phrase "in a plan view" means viewing an object portion from the top, and the phrase "in a cross-sectional view" means viewing a cross-section of which the object portion is vertically cut from the side.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). The term "about" can mean within one or more standard deviations, or within ±30 percent (%), 20%, 10%, 5% of the stated value, for example. Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the invention, and will not be interpreted in an idealized or overly formal sense unless expressly so defined herein.

A display device in an embodiment will now be described with reference to FIG. 1 and FIG. 2.

Figure 2:
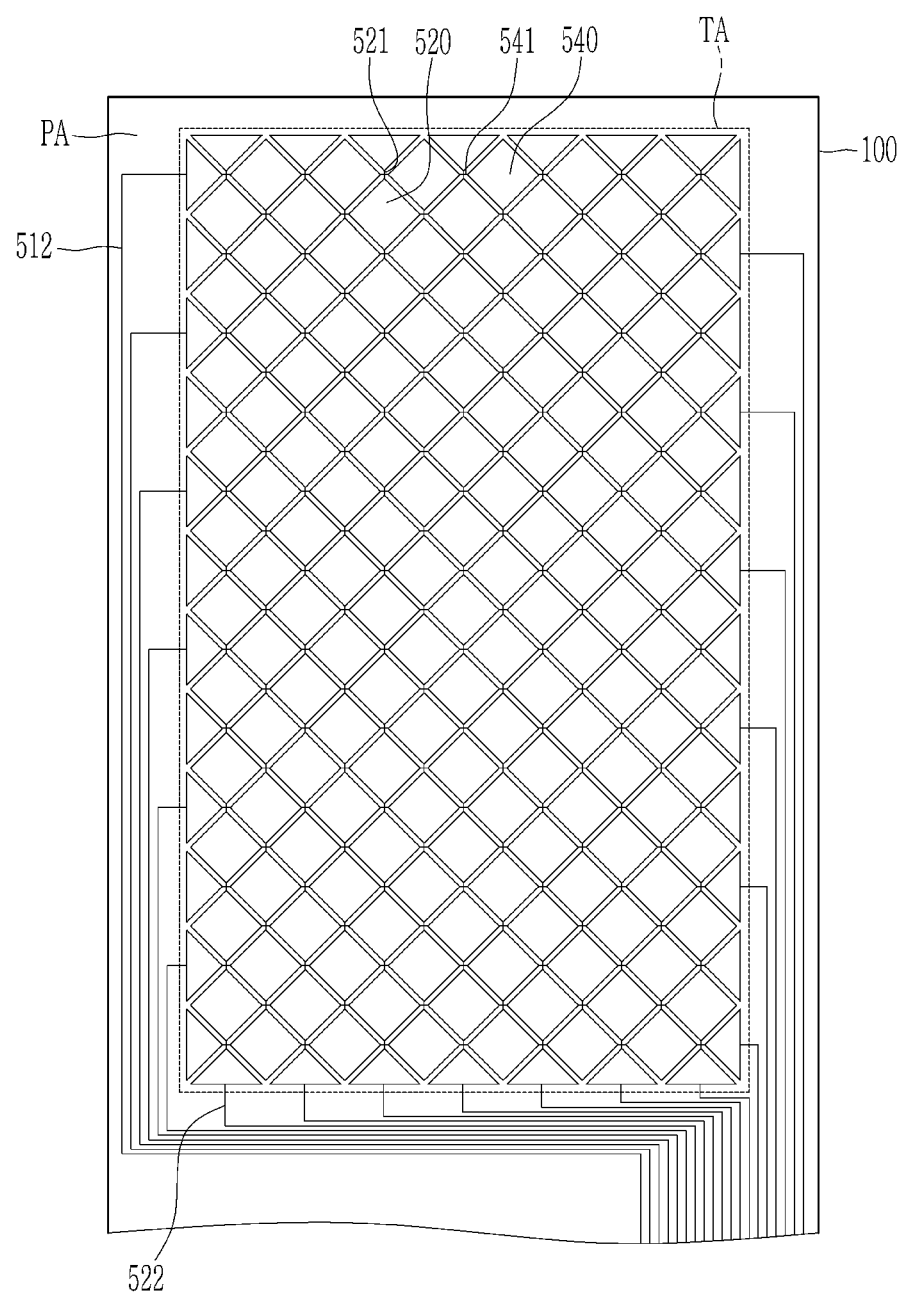
FIG. 2 shows a top plan view of an embodiment of a portion including a sensor in a display device.

FIG. 1 shows a top plan view of an embodiment of a display device, and FIG. 2 shows a top plan view of an embodiment of a portion including a sensor in a display device.

As shown in FIG. 1, the display device includes a substrate 100 and a pad unit 30.

The substrate 100 includes a display area DA and a non-display area NA. The display area DA is a region in which pixels including light-emitting diodes ("LED") and transistors are formed or provided to display images, and the non-display area NA is a region non-displaying images. The non-display area NA may surround the display area DA. The non-display area NA includes a pad unit 30 in which a pad PAD for applying driving signals to pixels is formed or provided.

A plurality of pixels (not shown) including transistors and LEDs may be disposed in the display area DA. The pixels may be arranged in various forms, for example, a matrix form. A sensing region TA including a plurality of sensing electrodes (520 and 540 of FIG. 2) may be further disposed on an upper portion of the display area DA so as to recognize touches.

Driving voltage lines (not shown) for transmitting driving signals such as voltages or signals to the pixels formed or provided in the display area DA, driving low voltage lines (not shown), and a pad unit 30 may be disposed in the non-display area NA. A plurality of sensing wires (512 and 522 of FIG. 2) may be further disposed in the non-display area NA. The sensing wires 512 and 522 may be connected to a plurality of sensing electrodes 520 and 540. The sensing wires 512 and 522 and the sensing electrodes 520 and 540 will be described in detail with reference to FIG. 2.

The pad unit 30 is disposed in part of the non-display area NA, and includes a plurality of pads PAD. Voltages and signals may be applied to a plurality of voltage lines (not shown) and the sensing wires (512 and 522 of FIG. 2) connected to the display area DA through a plurality of pads PAD. A flexible printed circuit board (("FPCB"), not shown) may be attached to the non-display area NA. The FPCB may be electrically connected to the pad unit 30. The FPCB and the pad unit 30 may be electrically connected to each other by an anisotropic conductive film. The FPCB may include a driving integrated circuit (("IC"), not shown), and driving signals output by the driving IC may be supplied to the respective pixels through the pads PAD of the pad unit 30.

As shown in FIG. 2, the substrate 100 further includes a sensing region TA in which a plurality of sensing electrodes 520 and 540 is formed or provided and a peripheral area PA for surrounding the sensing region TA on an upper portion of the display area DA. In an embodiment, the sensing region TA may include part of the display area DA and the non-display area NA of FIG. 1, and the peripheral area PA may include a region excluding the sensing region TA in the non-display area NA of FIG. 1. This is, however, an example, and the sensing region TA and the peripheral area PA may have various other positions. In an embodiment, the sensing region TA may include part of the display area DA, and the peripheral area PA may include a region excluding the sensing region TA from the display area DA and the non-display area NA, for example. In another embodiment, the sensing region TA may include the display area DA and the non-display area NA.

A plurality of sensing electrodes 520 and 540 may be disposed in the sensing region TA. The sensing electrodes 520 and 540 may include a plurality of first sensing electrodes 520 and a plurality of second sensing electrodes 540. The sensing electrodes 520 and 540 may be formed or disposed on the substrate 100 including a plurality of pixels. That is, the pixels and the sensing electrodes 520 and 540 may be disposed on the single panel.

The first sensing electrodes 520 and the second sensing electrodes 540 may be electrically separated from each other. In an embodiment, the first sensing electrode 520 may be a sensing input electrode, and the second sensing electrode 540 may be a sensing output electrode. This is, however, not limiting, and the first sensing electrode 520 may be a sensing output electrode, and the second sensing electrode 540 may be a sensing input electrode.

The first sensing electrodes 520 and the second sensing electrodes 540 may be alternately distributed and may be disposed in a mesh form so that they may not overlap each other in the sensing region TA. The first sensing electrodes 520 may be disposed in a column direction and a row direction, and the second sensing electrodes 540 may be disposed in the column direction and the row direction. The first sensing electrodes 520 may be connected to each other in the column direction by first sensing electrode connectors 521, and the second sensing electrodes 540 may be connected to each other in the row direction by the second sensing electrode connector 541.

The first sensing electrodes 520 and the second sensing electrodes 540 may be disposed in the same layer. In another embodiment, the first sensing electrodes 520 and the second sensing electrodes 540 may be disposed in different layers, respectively. In an embodiment, the first sensing electrodes 520 and the second sensing electrodes 540 may have rhombus shapes, but are not limited thereto. The first sensing electrodes 520 and the second sensing electrodes 540 may be polygons such as quadrangles or hexagons, or may be circles or ovals, and they may be realized to have various shapes with, for example, protrusions so as to improve sensitivity of the sensor. The first sensing electrodes 520 and the second sensing electrodes 540 may be made with transparent conductors or opaque conductors. In an embodiment, the first sensing electrodes 520 and the second sensing electrodes 540 may include transparent conductive oxide ("TCO"), and the TCO may include at least one of an indium tin oxide ("ITO"), an indium zinc oxide ("IZO"), a zinc oxide (ZnO), a carbon nanotube ("CNT"), and graphene, for example. A plurality of openings may be defined in the first sensing electrodes 520 and the second sensing electrodes 540. The openings defined in the sensing electrodes 520 and 540 allow the light discharged from the LED to be discharged to the front without interference.

The first sensing electrodes 520 may be electrically connected to each other by the first sensing electrode connector (or a bridge) 521, and the second sensing electrodes 540 may be electrically connected to each other by the second sensing electrode connector 541. When the first sensing electrodes 520 are connected in the first direction, the second sensing electrodes 540 may be connected in the second direction crossing the first direction. When the first sensing electrode 520 and the second sensing electrode 540 are disposed in the same layer, one of the first sensing electrode connector 521 and the second sensing electrode connector 541 may be disposed in the same layer as the first sensing electrode 520 and the second sensing electrode 540, and the other thereof may be disposed in a different layer from the first sensing electrode 520 and the second sensing electrode 540. As a result, the first sensing electrodes 520 and the second sensing electrodes 540 may be electrically separated from each other. The sensing electrode connector disposed in the different layer may be disposed on an upper layer or a lower layer of the first sensing electrode 520 and the second sensing electrode 540, and an embodiment in which the sensing electrode connector is disposed on the lower layer, that is, on the layer that is nearer the substrate, will be mainly described below.

The sensing wires 512 and 522 respectively connected to the first sensing electrodes 520 and the second sensing electrodes 540 are disposed in the peripheral area PA. The sensing wires 512 and 522 may include a plurality of first sensing wires 512 and a plurality of second sensing wires 522. The first sensing wires 512 may be connected to a plurality of second sensing electrodes 540 disposed in the row direction, and the second sensing wires 522 may be connected to a plurality of first sensing electrodes 520 disposed in the column direction. In an embodiment, the first sensing wires 512 and the second sensing wires 522 may be electrically connected to part of the pad PAD included in the pad unit 30 of FIG. 1.

FIG. 2 shows a mutual-cap type sensor for sensing touches by two sensing electrodes 520 and 540. However, in another embodiment, a self-cap type of sensor for sensing touches by one sensing electrode may be formed or provided.

A display device in an embodiment will now be described with reference to FIG. 3 and FIG. 4.

Figure 3:
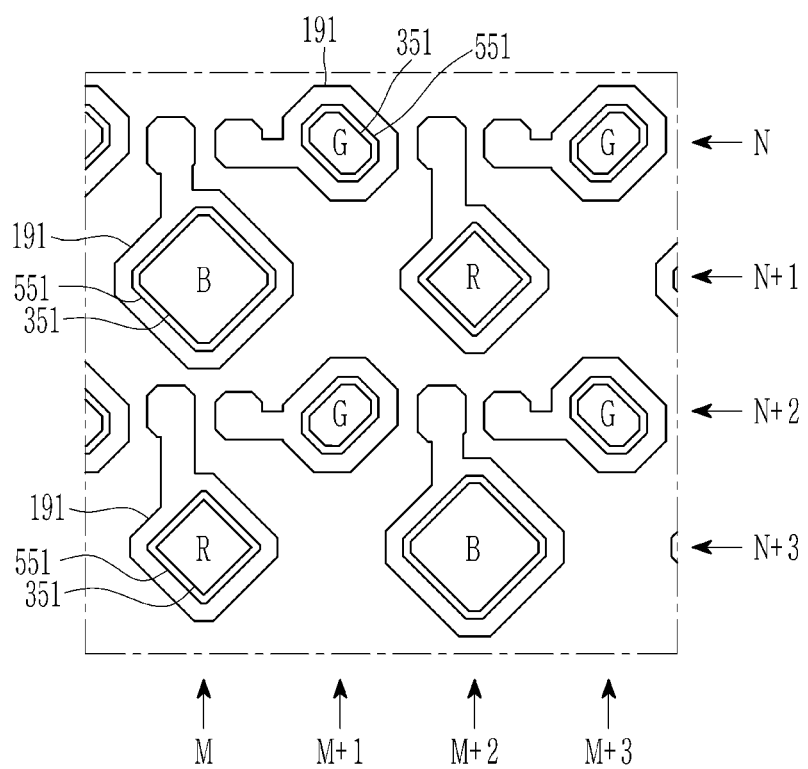
FIG. 3 shows a top plan view of an embodiment of a part of a display device.
Figure 4:
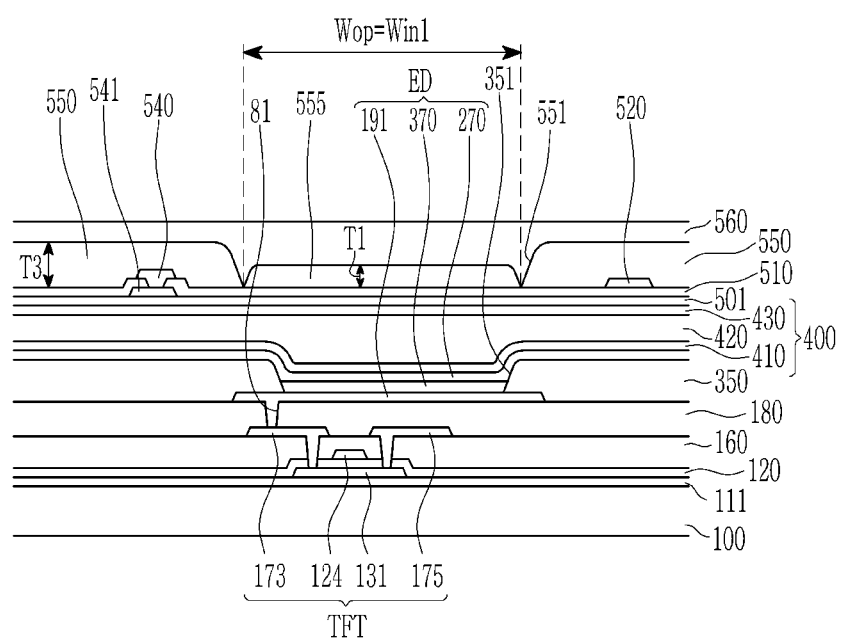
FIG. 4 shows a cross-sectional view of an embodiment of a part of a display device.

FIG. 3 shows a top plan view of an embodiment of a part of a display device, and FIG. 4 shows a cross-sectional view of an embodiment of a part of a display device.

As shown in FIG. 3, the display device may include a plurality of pixels R, G, and B. The pixels R, G, and B may include a first pixel R, a second pixel G, and a third pixel B.

The first pixel R may display the red, the second pixel G may display the green, and the third pixel B may display the blue. This is, however, an example, and the pixels may further include pixels displaying other colors in addition to red, green, and blue. In an embodiment, the pixels may further include a white pixel, for example. In another embodiment, the pixels may include a cyan displaying pixel, a magenta displaying pixel, and a yellow displaying pixel.

As shown in FIG. 4, a display area DA of the display device in an embodiment may include a substrate 100, a transistor TFT including a semiconductor 131, a gate electrode 124, a source electrode 173, and a drain electrode 175, a gate insulating layer 120, a first inter-insulating layer 160, a second inter-insulating layer 180, a pixel electrode 191, an emission layer 370, a bank layer 350, a common electrode 270, and an encapsulation layer 400. Here, the pixel electrode 191, the emission layer 370, and the common electrode 270 may configure a light-emitting device ED. The display device may further include a sensing region TA disposed on an upper portion of the display area DA, and the sensing region TA may include a sensing insulating layer 510, a plurality of sensing electrodes 520 and 540, and a second sensing electrode connector 541. The display device may further include a first insulating layer 555, a second insulating layer 560, and a third insulating layer 550 disposed on an upper portion of the sensing region TA.

The substrate 100 may include a rigid material such as glass, or a flexible material such as plastic or a polyimide, that may be bent. A buffer layer 111 for smoothing a surface of the substrate 100 and blocking permeation of impurities may be disposed on the substrate 100. In an embodiment, the buffer layer 111 may include an inorganic material, e.g., an inorganic insulating material such as a silicon nitride (SiNx), a silicon oxide (SiOx), or a silicon oxynitride (SiOxNy). The buffer layer 111 may be a single-layered or multi-layered of the material. A barrier layer (not shown) may be further disposed on the substrate 100. The barrier layer may be disposed between the substrate 100 and the buffer layer 111. In an embodiment, the barrier layer may include an inorganic insulating material such as a silicon nitride (SiNx), a silicon oxide (SiOx), or a silicon oxynitride (SiOxNy). The barrier layer may be a single-layered or multi-layered structure of the material.

The semiconductor 131 may be disposed on the substrate 100. The semiconductor 131 may include one of amorphous silicon, polycrystalline silicon, and an oxide semiconductor. In an embodiment, the semiconductor 131 may include a low temperature polycrystalline silicon ("LTPS") or may include an oxide semiconductor material including one of zinc (Zn), indium (In), gallium (Ga), tin (Sn), and any combinations thereof, for example. In an embodiment, the semiconductor 131 may include an indium-gallium-zinc oxide ("IGZO"), for example. The semiconductor 131 may include a channel region, a source region, and a drain region distinguished by whether impurities are doped thereto. The source region and the drain region may have conductive characteristics corresponding to conductors.

The gate insulating layer 120 may cover the semiconductor 131 and the substrate 100. In an embodiment, the gate insulating layer 120 may include an inorganic insulating material such as a silicon nitride (SiNx), a silicon oxide (SiOx), or a silicon oxynitride (SiOxNy). The gate insulating layer 120 may be a single-layered or multi-layered of the material.

The gate electrode 124 may be disposed on the gate insulating layer 120. In an embodiment, the gate electrode 124 may include a metal such as copper (Cu), molybdenum (Mo), aluminum (Al), silver (Ag), chromium (Cr), tantalum (Ta), or titanium (Ti), or a metal alloy thereof. The gate electrode 124 may be a single layer or a multilayer. A region of the semiconductor 131 overlapping the gate electrode 124 in a plan view may be a channel region.

The first inter-insulating layer 160 may cover the gate electrode 124 and the gate insulating layer 120. The first inter-insulating layer 160 may include an inorganic insulating material such as a silicon nitride (SiNx), a silicon oxide (SiOx), or a silicon oxynitride (SiOxNy). The first inter-insulating layer 160 may be a single-layered or multi-layered structure of the material.

The source electrode 173 and the drain electrode 175 may be position on the first inter-insulating layer 160. The source electrode 173 and the drain electrode 175 are respectively connected to the source region and the drain region of the semiconductor 131 by the openings defined in the first inter-insulating layer 160 and the gate insulating layer 120. Hence, the above-described semiconductor 131, the gate electrode 124, the source electrode 173, and the drain electrode 175 configure one transistor TFT. In another embodiment, the transistor TFT may not include the source electrode 173 and the drain electrode 175 but may include the source region and the drain region of the semiconductor 131.

In an embodiment, the source electrode 173 and the drain electrode 175 may include a metal such as aluminum (Al), copper (Cu), silver (Ag), gold (Au), platinum (Pt), palladium (Pd), nickel (Ni), molybdenum (Mo), tungsten (W), titanium (Ti), chromium (Cr), or tantalum (Ta), or a metal alloy thereof. The source electrode 173 and the drain electrode 175 may be a single layer or a multilayer. In an embodiment, the source electrode 173 and the drain electrode 175 may be a triple layer including an upper layer, an intermediate layer, and a lower layer, and the upper layer and the lower layer may include titanium (Ti), and the intermediate layer may include aluminum (Al).

The second inter-insulating layer 180 may be disposed on the source electrode 173 and the drain electrode 175. The second inter-insulating layer 180 covers the source electrode 173, the drain electrode 175, and the first inter-insulating layer 160. The second inter-insulating layer 180 planarizes the surface of the substrate 100 on which transistors TFT are installed, may be an organic insulator, and may include at least one material of polyimide, polyamide, acryl resin, benzocyclobutene, and phenol resin.

The pixel electrode 191 may be disposed on the second inter-insulating layer 180. The pixel electrode 191 may also be also referred to as an anode, and may be a single layer including a transparent conductive oxide film or a metal material, or a multilayer including the same. In an embodiment, the transparent conductive oxide film may include an ITO, a poly-ITO, an IZO, an GZO, and an indium tin zinc oxide ("ITZO"). In an embodiment, the metal material may include silver (Ag), molybdenum (Mo), copper (Cu), gold (Au), and aluminum (Al).

A via-hole 81 exposing the drain electrode 175 may be defined in the second inter-insulating layer 180. The drain electrode 175 and the pixel electrode 191 may be physically and electrically connected to each other through the via-hole 81 of the second inter-insulating layer 180. Accordingly, the pixel electrode 191 may receive an output current to be transmitted to the emission layer 370 from the drain electrode 175.

A bank layer 350 may be disposed on the pixel electrode 191 and the second inter-insulating layer 180. The bank layer 350 is also referred to as a pixel defining layer, and a pixel opening 351 overlapping at least part of the pixel electrode 191 is defined in the bank layer 350. The pixel opening 351 may overlap a center portion of the pixel electrode 191, and may not overlap an edge of the pixel electrode 191. Therefore, the pixel opening 351 may be smaller than the pixel electrode 191. The bank layer 350 may partition a formation position of the emission layer 370 so that the emission layer 370 may be disposed on a portion in which an upper side of the pixel electrode 191 is exposed. In an embodiment, the bank layer 350 may be an organic insulator including at least one material of polyimide, polyamide, acryl resin, benzocyclobutene, and phenol resin. In an embodiment, the bank layer 350 may be formed or provided with a black pixel defining layer including a black color pigment.

The pixel opening 351 may have a similar shape to that of the pixel electrode 191 in a plan view. In an embodiment, the pixel opening 351 and the pixel electrode 191 may have substantially polygonal shapes in a plan view, for example. Corners of the pixel opening 351 and the pixel electrode 191 may be chamfered. The pixel electrode 191 may include an extended portion for a connection to the drain electrode 175. The shapes of the pixel opening 351 and the pixel electrode 191 in a plan view are not limited thereto, and may be modifiable in many ways.

In this instance, a plurality of pixel electrodes 191 corresponding to the first pixel R, the second pixel G, and the third pixel B may have different sizes from one another in a plan view. In a like manner, a plurality of pixel openings 351 corresponding to the first pixel R, the second pixel G, and the third pixel B may have different sizes from one another in a plan view. In an embodiment, the pixel opening 351 and the pixel electrode 191 corresponding to the first pixel R may be bigger than the pixel opening 351 and the pixel electrode 191 corresponding to the second pixel G in a plan view, for example. The pixel opening 351 and the pixel electrode 191 corresponding to the first pixel R may be smaller than or similar to the pixel opening 351 and the pixel electrode 191 corresponding to the third pixel B. However, without being limited thereto, the sizes of the pixel opening 351 and the pixel electrode 191 of the respective pixels R, G, and B are modifiable in various ways.

In addition, the pixels of the display device in an embodiment may be disposed in the row direction and the column direction. In an embodiment, a plurality of pixel electrodes 191 corresponding to the second pixel G may be disposed at predetermined intervals in the N-th row (where N is a natural number), and pixel electrodes 191 corresponding to the third pixel B and the pixel electrode 191 corresponding to the first pixel R may be alternately disposed in the adjacent (N+1)-th row, for example. In a like manner, a plurality of pixel electrodes 191 corresponding to the second pixel G may be disposed at predetermined intervals in the adjacent (N+2)-th row, and pixel electrodes 191 corresponding to the first pixel R and pixel electrodes 191 corresponding to the third pixel B may be alternately disposed in the adjacent (N+3)-th row.

A plurality of pixel electrodes 191 corresponding to the second pixel G disposed in the N-th row and pixel electrodes 191 corresponding to the third pixel B and the first pixel R disposed in the (N+1)-th row may be alternately disposed. In an embodiment, the pixel electrodes 191 corresponding to the third pixel B and the pixel electrodes 191 corresponding to the first pixel R may be alternately disposed in the M-th column (M is a natural number), and a plurality of pixel electrodes 191 corresponding to the second pixel G may be disposed at predetermined intervals in the adjacent (M+1)-th column, for example. In a like manner, the pixel electrodes 191 corresponding to the first pixel R and the pixel electrodes 191 corresponding to the third pixel B may be alternately disposed in the adjacent (M+2)-th column, and a plurality of pixel electrodes 191 corresponding to the second pixel G may be disposed at predetermined intervals in the adjacent (M+3)-th column. The pixel electrodes 191 may be repeatedly disposed with the above-noted structure on the substrate 100.

The emission layer 370 may be disposed in the pixel opening 351 partitioned by the bank layer 350. The emission layer 370 may be disposed on the pixel electrode 191. The emission layer 370 may include organic materials for emitting light of red, green, blue, etc. The emission layer 370 for emitting red, green, and blue light may include a low molecular or polymer organic material. The emission layer 370 disposed on the first pixel R may include an organic material for emitting red light. The emission layer 370 disposed on the second pixel G may include an organic material for emitting green light. The emission layer 370 disposed on the third pixel B may include an organic material for emitting blue light.

FIG. 4 shows a single-layer emission layer 370, and in actuality, auxiliary layers such as an electron injecting layer, an electron transport layer, a hole transport layer, and a hole injecting layer may be further disposed above/below the emission layer 370. The hole injecting layer and the hole transport layer may be disposed on a lower portion of the emission layer 370, and the electron transport layer and the electron injecting layer may be disposed on an upper portion of the emission layer 370.

Although not shown, a spacer may be further disposed on the bank layer 350. The spacer may include the same material as that of the bank layer 350. However, without being limited thereto, the spacer may include a material that is different from that of the bank layer 350. The spacer may be an organic insulator including at least one material of polyimide, polyamide, acryl resin, benzocyclobutene, and phenol resin.

The common electrode 270 may be disposed on the bank layer 350 and the emission layer 370. The common electrodes 270 of the respective pixels R, G, and B may be connected to each other. The common electrodes 270 may be formed or provided to be generally connected to each other on the substrate 100. In an embodiment, the common electrodes 270 may also be also referred to as a cathode, and may include a transparent conductive layer including an ITO, an IZO, an IGZO, and an ITZO. The common electrodes 270 may have a semi-transparent characteristic, and may configure a microcavity with the pixel electrode 191. According to the microcavity structure, light with a predetermined wavelength is discharged upward by a gap between two electrodes and the characteristic, thereby displaying the red, the green, or the blue.

The pixel electrode 191, the emission layer 370, and the common electrode 270 may configure a light-emitting device ED. A portion in which the pixel electrode 191, the emission layer 370, and the common electrode 270 overlap each other may be a light-emitting region of the light-emitting device ED.

The encapsulation layer 400 may be disposed on the common electrode 270. The encapsulation layer 400 may include at least one inorganic film and at least one organic film. In the illustrated embodiment of FIG. 4, the encapsulation layer 400 may include a first inorganic encapsulation layer 410, an organic encapsulation layer 420, and a second inorganic encapsulation layer 430. This is, however, an example, and the number of inorganic films and organic films configuring the encapsulation layer 400 is modifiable in many ways. The first inorganic encapsulation layer 410, the organic encapsulation layer 420, and the second inorganic encapsulation layer 430 may be disposed in part of the display area DA and the non-display area NA. In an embodiment, the organic encapsulation layer 420 is formed or provided with respect to the display area DA, and the first inorganic encapsulation layer 410 and the second inorganic encapsulation layer 430 may be formed or provided up to the non-display area NA. The encapsulation layer 400 protects the light-emitting device ED from moisture or oxygen that may be input from the outside, and one of end portions of the first inorganic encapsulation layer 410 and the second inorganic encapsulation layer 430 may be formed or provided to directly contact each other.

A buffer layer 501 may be disposed on the encapsulation layer 400. In an embodiment, the buffer layer 501 may include an inorganic insulating layer, and the inorganic material included in the inorganic insulating layer may include at least one of a silicon nitride, an aluminum nitride, a zirconium nitride, a titanium nitride, a hafnium nitride, a tantalum nitride, a silicon oxide, an aluminum oxide, a titanium oxide, a tin oxide, a cerium oxide, and a silicon oxynitride. In another embodiment, the buffer layer 501 may be omitted.

A second sensing electrode connector 541, a sensing insulating layer 510, and a plurality of sensing electrodes 520 and 540 may be disposed on the buffer layer 501. Although not shown, a first sensing electrode connector (521 of FIG. 2) may be disposed on the buffer layer 501. One of the first sensing electrode connector (521 of FIG. 2) and the second sensing electrode connector 541 may be disposed in the same layer as the sensing electrodes 520 and 540, and the other may be disposed in a layer that is different from that of the sensing electrodes 520 and 540. Hereinafter, an example in which the second sensing electrode connector 541 is disposed in the layer that is different from that of the sensing electrodes 520 and 540 is described.

The second sensing electrode connector 541, the sensing insulating layer 510, and the sensing electrodes 520 and 540 may configure a detecting sensor. The detecting sensor may be classified into a resistive type, a capacitive type, an electro-magnetic type, and an optical type. The detecting sensor in an embodiment may use the capacitive sensor.

The second sensing electrode connector 541 may be disposed on the buffer layer 501, and the sensing insulating layer 510 may be disposed on the buffer layer 501 and the second sensing electrode connector 541. The sensing insulating layer 510 may include an inorganic insulating material or an organic insulating material. The inorganic insulating material may include at least one of a silicon nitride, an aluminum nitride, a zirconium nitride, a titanium nitride, a hafnium nitride, a tantalum nitride, a silicon oxide, an aluminum oxide, a titanium oxide, a tin oxide, a cerium oxide, and a silicon oxynitride. The organic insulating material may include at least one of an acryl-based resin, a methacryl-based resin, polyisoprene, a vinyl-based resin, an epoxy-based resin, a urethane-based resin, a cellulose-based resin, and a perylene-based resin.

The sensing electrodes 520 and 540 may be disposed on the sensing insulating layer 510. The sensing electrodes 520 and 540 may include a plurality of first sensing electrodes 520 and a plurality of second sensing electrodes 540. The first sensing electrode 520 and the second sensing electrode 540 may be electrically insulated from each other. An opening for exposing an upper side of the second sensing electrode connector 541 may be defined in the sensing insulating layer 510, and the second sensing electrode connector 541 may be connected to connected to the second sensing electrode 540, thereby electrically connecting the two second sensing electrodes 540 that are adjacent to each other. The first sensing electrode connector (521 of FIG. 2) for connecting the first sensing electrode 520 may be formed or provided in the same layer as the first sensing electrode 520 and the second sensing electrode 540.

The sensing electrodes 520 and 540 may have conductive materials with excellent conductivity. In an embodiment, the sensing electrodes 520 and 540 may include a metal such as aluminum (Al), copper (Cu), silver (Ag), gold (Au), platinum (Pt), palladium (Pd), nickel (Ni), molybdenum (Mo), tungsten (W), titanium (Ti), chromium (Cr), or tantalum (Ta), or a metal alloy thereof, for example. The sensing electrodes 520 and 540 may be a single layer or a multilayer. Openings may be defined in the sensing electrodes 520 and 540 so that the light discharged by the LED may be discharged upward without interference. In an embodiment, the sensing electrodes 520 and 540 may be a triple layer including an upper layer, an intermediate layer, and a lower layer, and the upper layer and the lower layer may include titanium (Ti) and the intermediate layer may include aluminum (Al).

A first insulating layer 555 is disposed on the sensing insulating layer 510. The first insulating layer 555 may be disposed on the encapsulation layer 400, and the sensing insulating layer 510 may be disposed between the encapsulation layer 400 and the first insulating layer 555. The first insulating layer 555 may overlap the light-emitting device ED. That is, the first insulating layer 555 may overlap the pixel electrode 191, the emission layer 370, and the pixel opening 351. The first insulating layer 555 may be bigger than the pixel opening 351. Hence, the first insulating layer 555 may overlap an entirety of the pixel opening 351. That is, the first insulating layer 555 may cover an entirety of the pixel opening 351.

A second insulating layer 560 is disposed on the first insulating layer 555. The second insulating layer 560 may also be disposed on the third insulating layer 550. That is, the second insulating layer 560 may cover the first insulating layer 555 and the third insulating layer 550. The second insulating layer 560 may be disposed on an entirety of the substrate 100.

A third insulating layer 550 may be disposed on the sensing insulating layer 510. The third insulating layer 550 may be disposed on the sensing electrodes 520 and 540. Therefore, the sensing electrodes 520 and 540 may be covered by the third insulating layer 550. The third insulating layer 550 may surround the first insulating layer 555. An opening 551 may be defined in the third insulating layer 550. The opening 551 of the third insulating layer 550 may overlap the pixel opening 351. The opening 551 of the third insulating layer 550 may be bigger than the pixel opening 351. The pixel opening 351 may be defined in the opening 551 of the third insulating layer 550 in a plan view.

A first insulating layer 555 may be disposed in the opening 551 of the third insulating layer 550. A width Wop of the opening 551 of the third insulating layer 550 may be substantially equal to a width Win1 of the first insulating layer 555. An end portion of the first insulating layer 555 may contact an end portion of the third insulating layer 550. A thickness T3 of the third insulating layer 550 may be greater than a thickness T1 of the first insulating layer 555.

Refractive indices of the first insulating layer 555, the second insulating layer 560, and the third insulating layer 550 are different from one another. The refractive index of the first insulating layer 555 may be greater than the refractive index of the third insulating layer 550. The refractive index of the second insulating layer 560 may be less than the refractive index of the first insulating layer 555. The refractive index of the second insulating layer 560 may be greater than the refractive index of the third insulating layer 550. The refractive indices of the first insulating layer 555, the second insulating layer 560, and the third insulating layer 550 may be each equal to or greater than about 1.28 and equal to or less than about 1.95. A difference between the refractive index of the first insulating layer 555 and the refractive index of the second insulating layer 560 may be equal to or greater than about 0.01 and equal to or less than about 0.67. Preferably, the difference between the refractive index of the first insulating layer 555 and the refractive index of the second insulating layer 560 may be equal to or greater than about 0.05. The difference between the refractive index of the second insulating layer 560 and the refractive index of the third insulating layer 550 may be equal to or greater than about 0.01 and equal to or less than about 0.67. Preferably, the difference between the refractive index of the second insulating layer 560 and the refractive index of the third insulating layer 550 may be equal to or greater than about 0.05.

In an embodiment, the refractive index of the first insulating layer 555 may be equal to or greater than about 1.6, the refractive index of the second insulating layer 560 may be equal to or greater than about 1.50 and equal to or less than about 1.55, and the refractive index of the third insulating layer 550 may be equal to or less than about 1.46, for example. This is, however, an example, and the refractive index of the first insulating layer 555, the refractive index of the second insulating layer 560, and the refractive index of the third insulating layer 550 may be changeable in many ways.

The first insulating layer 555, the second insulating layer 560, and the third insulating layer 550 may include organic insulating materials. The refractive indexes of the first insulating layer 555, the second insulating layer 560, and the third insulating layer 550 may be adjusted according to functional groups included in the respective layers. In another embodiment, the refractive indexes of the first insulating layer 555, the second insulating layer 560, and the third insulating layer 550 may be adjusted according to types and contents of nanoparticles included in the respective layers.

In an embodiment, the refractive index of the layer including a material generated by spreading hollow silica to the acryl-based resin or the siloxane resin may be about 1.30 to about 1.53, for example. In an embodiment, the refractive index of the layer including an acryl-based resin including fluorine (F) may be about 1.38 to about 1.53. In an embodiment, the refractive index of the layer including material including the functional group such as an aromatic ring in a binder of a resin such as an acryl-based resin, a siloxane resin, or a polyimide may be about 1.50 to about 1.65. In an embodiment, the refractive index of the layer including an acryl-based resin including a halogen element such as iodine (I) or bromine (Br), or an element such as sulfur (S), phosphorus (P), or silicon (Si) may be about 1.60 to about 1.70. In an embodiment, the refractive index of the layer including an acryl-based resin including nanoparticles such as a titanium oxide (TiO2), a zirconium oxide (ZrO2), or a graphene may be about 1.50 to about 1.90. The refractive index of the layer including an organometallic polymer including an acryl-based resin and a siloxane resin may be about 1.60 to about 1.90. In an embodiment, the above-noted refractive index may be a value that is measured by light (sodium D-line) of about 589 nanometers (nm).

The first insulating layer 555, the second insulating layer 560, and the third insulating layer 550 may be made by various methods. In an embodiment, the organic insulating material may be processed to have photosensitivity, the same is entirely formed or provided, and a photo process is progressed to perform patterning, for example. In another embodiment, a desired pattern may be formed or provided by an inkjet process. In another embodiment, the organic insulating material is entirely formed or provided by a method such as slit coating, spin coating, or screen printing, a photoresist including novolak is formed or provided, and a photolithography and etching process is performed or provided to form a desired pattern.

Although not shown, a polarization layer may be further disposed on the second insulating layer 560. The polarization layer may be disposed in the sensing region TA, and may include a linear polarizer and a retarder.

A cover window for protecting the sensing region TA and the display area DA may be further disposed in the sensing region TA. An adhesive layer may be further disposed between the polarization layer and the cover window.

The display device in an embodiment includes the first insulating layer 555, the second insulating layer 560, and the third insulating layer 550 having different refractive indices from one another, thereby increasing visibility at the front and light-outputting efficiency of the display device. A path of light generated by a display device in an embodiment will now be described with reference to FIG. 5.

Figure 5:
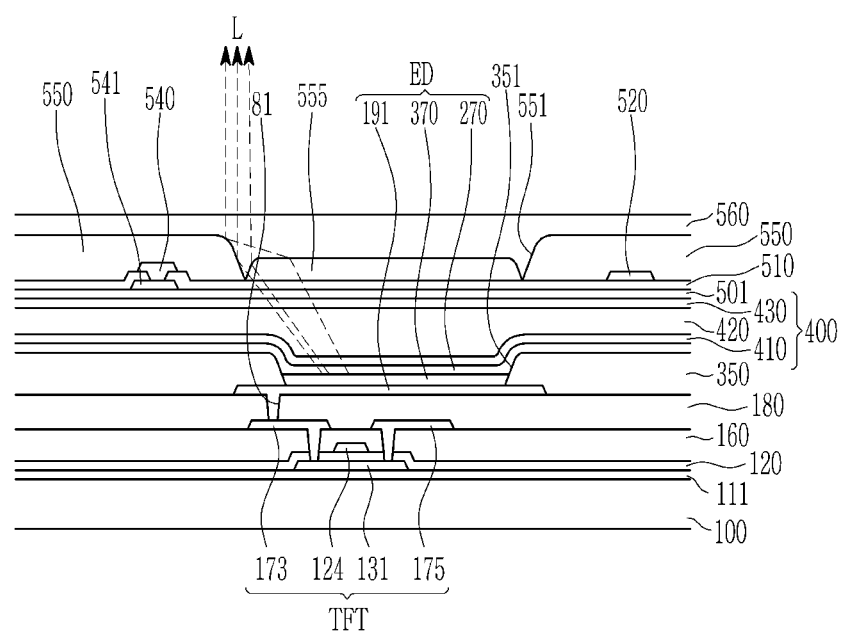
FIG. 5 shows an embodiment of a path of light generated by a light-emitting device of a display device.

FIG. 5 shows a path of light generated by a light-emitting device of a display device.

As shown in FIG. 5, the light L generated by the light-emitting device ED may pass through the first insulating layer 555 and the second insulating layer 560 and may be output to the front. That is, the light L may be discharged in a direction that is perpendicular to the substrate 100. Some of the light L generated by the light-emitting device ED may progress in an oblique direction with respect to the substrate 100, may be reflected at the cover window, and may be returned. In an embodiment of the display device, the light L generated by the light-emitting device ED may be refracted at an interface between the first insulating layer 555 and the second insulating layer 560. Some of the light refracted while passing through a lateral side of the first insulating layer 555 may pass through the second insulating layer 560 and may be output to the front. Other of the light refracted while passing through the lateral side of the first insulating layer 555 may be reflected at the third insulating layer 550 and may be output to the front. Some of the light refracted while passing through the upper side of the first insulating layer 555 may be reflected at the third insulating layer 550 and may be output to the front. That is, some of the light input to the second insulating layer 560 after passing through the first insulating layer 555 may be reflected at the interface of the second insulating layer 560 and the third insulating layer 550 and may be output to the front.

When an incidence angle of the light L input to the second insulating layer 560 is greater than a threshold angle, the incident light L may be totally reflected at the interface of the third insulating layer 550 and the second insulating layer 560. That is, when the light L input to the second insulating layer 560 with a relatively big refractive index progresses to the third insulating layer 550 with a relatively small refractive index, a total reflection may be generated at the interface between the third insulating layer 550 and the second insulating layer 560. The interface between the third insulating layer 550 and the second insulating layer 560 may define a predetermined angle with respect to a straight line that is parallel to the substrate 100. The interface between the third insulating layer 550 and the second insulating layer 560 may be the lateral side of the third insulating layer 550. Therefore, the lateral side of the third insulating layer 550 may be slanted with a predetermined inclined angle with respect to the upper side of the sensing insulating layer 510.

An embodiment of a display device and a reference example of a display device will now be compared and described with reference to FIG. 6.

Figure 6:
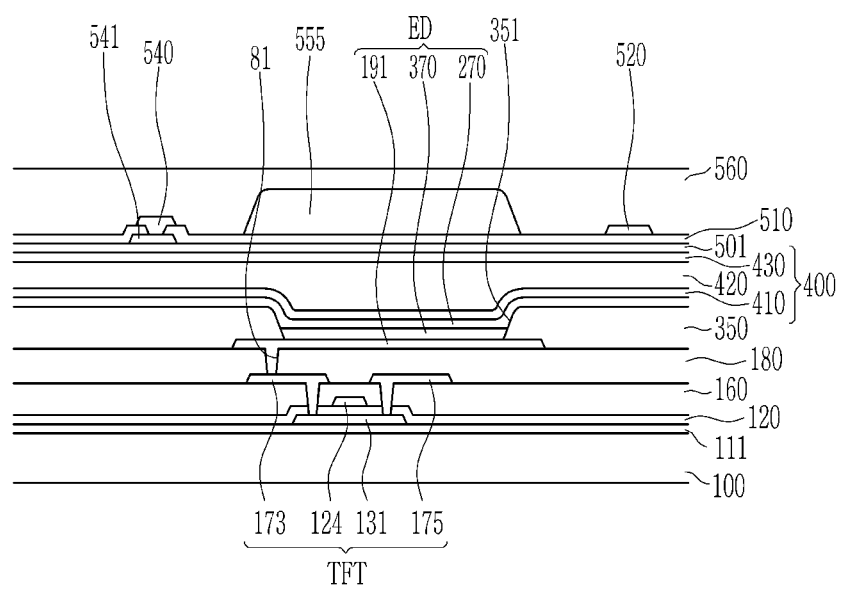
FIG. 6 shows a cross-sectional view of a reference example of a display device.

FIG. 6 shows a cross-sectional view of a reference example of a display device.

As shown in FIG. 6, a reference example of the display device mostly includes the same constituent elements as those of an embodiment of the display device, and does not include constituent elements corresponding to the third insulating layer. That is, a reference example of the display device includes a first insulating layer 555 disposed on the sensing insulating layer 510 and a second insulating layer 560 disposed on the first insulating layer 555. The first insulating layer 555 may overlap the pixel opening 351, and the second insulating layer 560 may cover the upper side and the lateral side of the first insulating layer 555. The refractive index of the second insulating layer 560 may be less than the refractive index of the first insulating layer 555.

The light generated by the light-emitting device ED of a reference example of the display device may pass through the first insulating layer 555 and the second insulating layer 560 and may be output to the front. The light passing through the lateral side of the first insulating layer 555 may be refracted at the interface between the first insulating layer 555 and the second insulating layer 560. Some of the light refract while passing through the lateral side of the first insulating layer 555 may be output to the front. Therefore, a reference example of the display device may increase the light-outputting efficiency toward the front, compared to the structure non-including the first insulating layer 555. The light-outputting efficiency depends on the taper angle of the lateral side of the first insulating layer 555 with respect to the upper side of the sensing insulating layer 510. The light-outputting efficiency may also be changed according to the refractive index of the first insulating layer 555, the refractive index of the second insulating layer 560, and a thickness of the first insulating layer 555. Regarding a reference example of the display device, the refractive index of the first insulating layer 555 may be about 1.64, the refractive index of the second insulating layer 560 may be about 1.47, and the thickness of the first insulating layer 555 may be about 3.2 micrometers (μm), for example. Regarding a reference example of the display device, compared to the structure in which the first insulating layer 555 is omitted, the light-outputting efficiency of the red pixel may be increased by about 20.5%, the light-outputting efficiency of the green pixel may be increased by about 16.5%, and the light-outputting efficiency of the blue pixel may be increased by about 5.9%. With reference to the white light that is a combination of the light output by the red pixel, the green pixel, and the blue pixel, the light-outputting efficiency is increased by about 16.3%.

The light L generated by the light-emitting device ED of an embodiment of the display device may pass through the first insulating layer 555 and the second insulating layer 560 and may be output to the front. The light L passing through the lateral side of the first insulating layer 555 may be refracted at the interface between the first insulating layer 555 and the second insulating layer 560. Some of the light refracted while passing through the lateral side of the first insulating layer 555 may be output to the front. Some of the light input to the second insulating layer 560 may be reflected at the third insulating layer 550 and may be output to the front. An embodiment of the display device may increase the light-outputting efficiency to the front, compared to a reference example of the display device. The display device in an embodiment may increase the light-outputting efficiency to the front, compared to the structure in which the first insulating layer 555 and the third insulating layer 550 are omitted. The light-outputting efficiency may be changed according to the taper angle between the lateral side of the first insulating layer 555 and the upper side of the sensing insulating layer 510 and the taper angle between the lateral side of the third insulating layer 550 and the upper side of the sensing insulating layer 510. The light-outputting efficiency may be changed according to the refractive index of the first insulating layer 555, the refractive index of the second insulating layer 560, and the thickness of the first insulating layer 555. In an embodiment of the display device, the refractive index of the first insulating layer 555 may be about 1.64, the refractive index of the third insulating layer 550 may be about 1.47, the thickness of the first insulating layer 555 may be about 3.2 μm, and the thickness of the third insulating layer 550 may be about 5 μm, for example. In an embodiment of the display device, compared to the structure in which the first insulating layer 555 and the third insulating layer 550 are omitted, the light-outputting efficiency of the red pixel may be increased by about 25.2%, the light-outputting efficiency of the green pixel may be increased by about 20.2%, and the light-outputting efficiency of the blue pixel may be increased by about 7.2%. With reference to the white light that is a combination of the light output by the red pixel, the green pixel, and the blue pixel, the light-outputting efficiency is increased by about 20.0%. Therefore, the light-outputting efficiency of the white light of an embodiment of the display device may be increased by about 3.7% compared to a reference example of the display device.

A display device in an embodiment will now be described with reference to FIG. 7.

The display device in an embodiment shown in FIG. 7 mostly corresponds to the display device in an embodiment described with reference to FIG. 1 to FIG. 5, so a description regarding the same portions will be omitted. The first insulating layer is spaced from the third insulating layer in the illustrated embodiment of FIG. 7, which is different from the above-described embodiment, and which will now be described.

Figure 7:
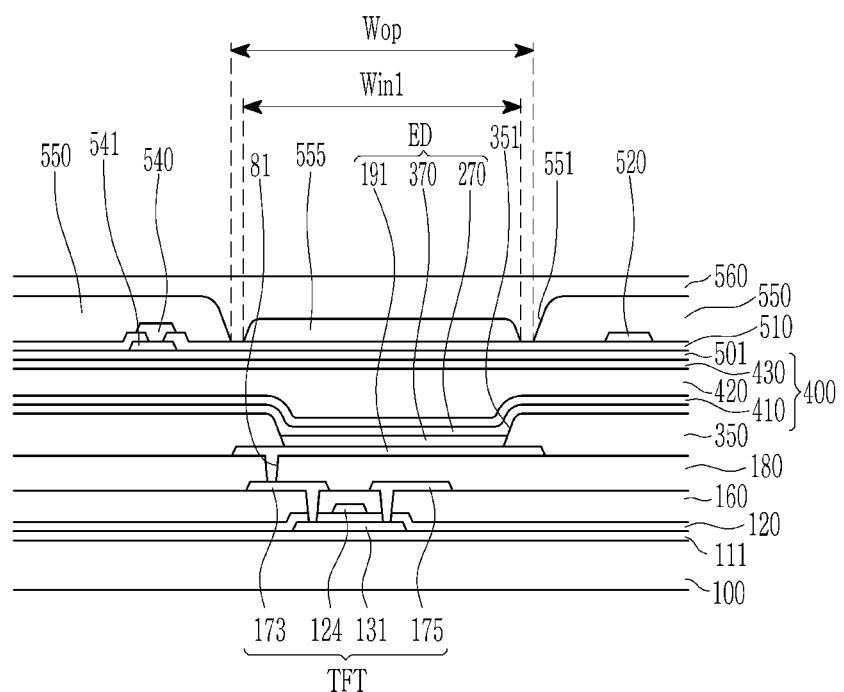
FIG. 7 shows a cross-sectional view of an embodiment of a part of a display device.

FIG. 7 shows a cross-sectional view of an embodiment of a part of a display device.

As shown in FIG. 7, the display device may include a substrate 100, a transistor TFT disposed on the substrate 100, a light-emitting device ED connected to the transistor TFT, and an encapsulation layer 400 disposed on the light-emitting device ED. A sensing insulating layer 510, a plurality of sensing electrodes 520 and 540, a second sensing electrode connector 541, a first insulating layer 555, a second insulating layer 560, and a third insulating layer 550 may be disposed on the encapsulation layer 400.

The first insulating layer 555 may overlap the pixel opening 351, and may be disposed in the opening 551 of the third insulating layer 550. The second insulating layer 560 may be disposed on the first insulating layer 555 and the third insulating layer 550.

In the previous embodiment, the end portion of the first insulating layer 555 may contact the end portion of the third insulating layer 550, and in the illustrated embodiment of FIG. 7, the end portion of the first insulating layer 555 may not contact the end portion of the third insulating layer 550. The width Wop of the opening 551 of the third insulating layer 550 may be greater than the width Win1 of the first insulating layer 555. Therefore, the first insulating layer 555 may be spaced from the third insulating layer 550.

The first insulating layer 555, the second insulating layer 560, and the third insulating layer 550 have different refractive indices. The refractive index of the first insulating layer 555 may be greater than the refractive index of the second insulating layer 560, and the refractive index of the second insulating layer 560 may be greater than the refractive index of the third insulating layer 550. The display device includes the first insulating layer 555, the second insulating layer 560, and the third insulating layer 550 with different refractive indices, thereby increasing the front visibility and light-outputting efficiency of the display device.

A display device in an embodiment will now be described with reference to FIG. 8.

The display device in an embodiment shown in FIG. 8 mostly corresponds to the display device in an embodiment described with reference to FIG. 1 to FIG. 5, so a description regarding the same portions will be omitted. The third insulating layer covers the first insulating layer in the illustrated embodiment of FIG. 8, which is different from the above-described embodiment, and which will now be described.

Figure 8:
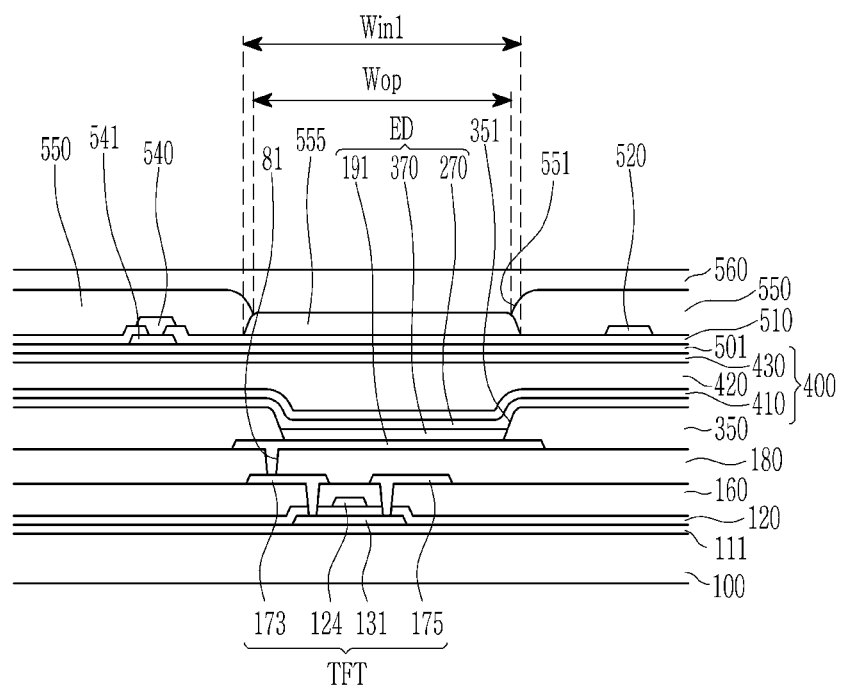
FIG. 8 shows a cross-sectional view of an embodiment of a part of a display device.

FIG. 8 shows a cross-sectional view of part of a display device.

As shown in FIG. 8, the display device may include a substrate 100, a transistor TFT disposed on the substrate 100, a light-emitting device ED connected to the transistor TFT, and an encapsulation layer 400 disposed on the light-emitting device ED. A sensing insulating layer 510, a plurality of sensing electrodes 520 and 540, a second sensing electrode connector 541, a first insulating layer 555, a second insulating layer 560, and a third insulating layer 550 may be disposed on the encapsulation layer 400.

The first insulating layer 555 may overlap the pixel opening 351, and may be disposed in the opening 551 of the third insulating layer 550. The second insulating layer 560 may be disposed on the first insulating layer 555 and the third insulating layer 550.

The first insulating layer 555 may not be covered by the third insulating layer 550 in the previous embodiment, and the first insulating layer 555 may be covered by the third insulating layer 550 in the illustrated embodiment of FIG. 8. The third insulating layer 550 may cover the lateral side of the first insulating layer 555. The width Wop of the opening 551 of the third insulating layer 550 may be less than the width Win1 of the first insulating layer 555. The third insulating layer 550 may not cover the upper side of the first insulating layer 555.

The first insulating layer 555, the second insulating layer 560, and the third insulating layer 550 have different refractive indices. The refractive index of the first insulating layer 555 may be greater than the refractive index of the second insulating layer 560, and the refractive index of the second insulating layer 560 may be greater than the refractive index of the third insulating layer 550. The display device includes the first insulating layer 555, the second insulating layer 560, and the third insulating layer 550 with different refractive indices, thereby increasing visibility at the front and light-outputting efficiency of the display device.

A display device in an embodiment will now be described with reference to FIG. 9.

The display device in an embodiment shown in FIG. 9 mostly corresponds to the display device in an embodiment described with reference to FIG. 1 to FIG. 5, so a description regarding the same portions will be omitted. The sensing insulating layer is omitted in the illustrated embodiment of FIG. 9, which is different from the above-described embodiment, and which will now be described.

Figure 9:
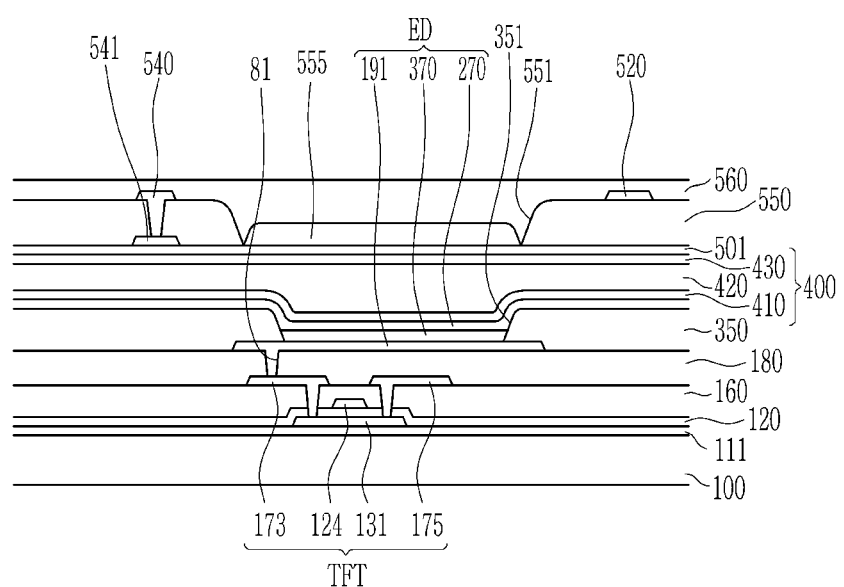
FIG. 9 shows a cross-sectional view of an embodiment of a part of a display device.

FIG. 9 shows a cross-sectional view of an embodiment of a part of a display device.

As shown in FIG. 9, the display device may include a substrate 100, a transistor TFT disposed on the substrate 100, a light-emitting device ED connected to the transistor TFT, and an encapsulation layer 400 disposed on the light-emitting device ED. A sensing insulating layer 510, a plurality of sensing electrodes 520 and 540, a second sensing electrode connector 541, a first insulating layer 555, a second insulating layer 560, and a third insulating layer 550 may be disposed on the encapsulation layer 400.

The first insulating layer 555 may overlap the pixel opening 351, and may be disposed in the opening 551 of the third insulating layer 550. The second insulating layer 560 may be disposed on the first insulating layer 555 and the third insulating layer 550. In the previous embodiment, the sensing insulating layer 510 may be disposed on the second sensing electrode connector 541, the sensing electrodes 520 and 540 may be disposed on the sensing insulating layer 510, and the third insulating layer 550 may be disposed on the sensing electrodes 520 and 540. In the illustrated embodiment of FIG. 9, the third insulating layer 550 may be disposed on the second sensing electrode connector 541, the sensing electrodes 520 and 540 may be disposed on the third insulating layer 550, and the second insulating layer 560 may be disposed on the sensing electrodes 520 and 540. The sensing insulating layer may be omitted. Therefore, the process may be further simplified, and costs may be reduced.

The third insulating layer 550 may be disposed between the sensing electrodes 520 and 540 and the second sensing electrode connector 541. An opening overlapping the second sensing electrode 540 and the second sensing electrode connector 541 may be defined in the third insulating layer 550, and the second sensing electrode 540 may be connected to the second sensing electrode connector 541 through the opening.

The first insulating layer 555, the second insulating layer 560, and the third insulating layer 550 have different refractive indices. The refractive index of the first insulating layer 555 may be greater than the refractive index of the second insulating layer 560, and the refractive index of the second insulating layer 560 may be greater than the refractive index of the third insulating layer 550. The display device in an embodiment includes the first insulating layer 555, the second insulating layer 560, and the third insulating layer 550 having different refractive indices from one another, thereby increasing visibility at the front and light-outputting efficiency of the display device.

A display device in an embodiment will now be described with reference to FIG. 10.

The display device in an embodiment shown in FIG. 10 mostly corresponds to the display device in an embodiment described with reference to FIG. 1 to FIG. 5, so a description regarding the same portions will be omitted. The third insulating layer covers the second insulating layer in the illustrated embodiment of FIG. 10, which is different from the above-described embodiment, and which will now be described.

Figure 10:
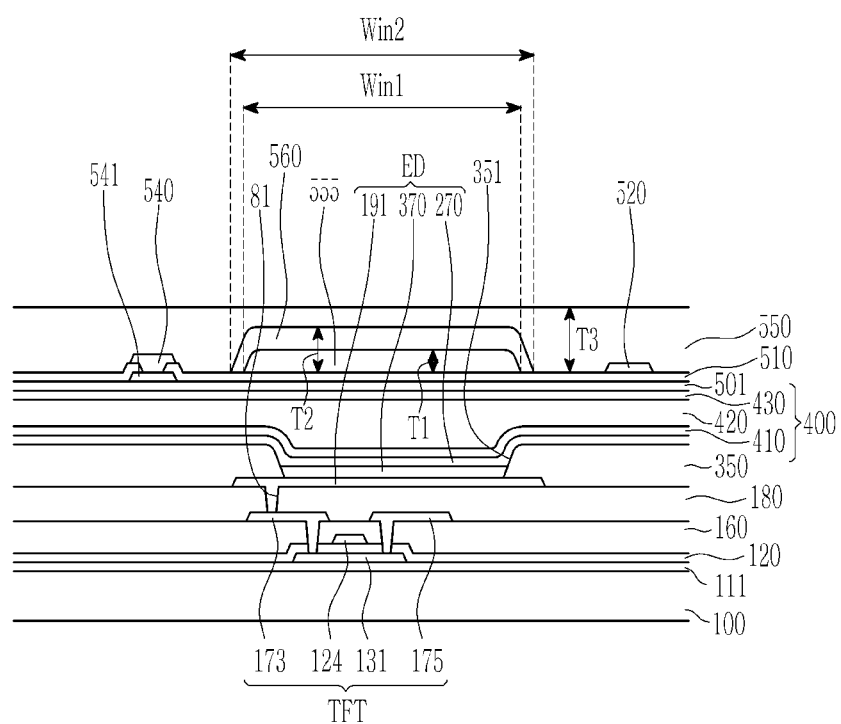
FIG. 10 shows a cross-sectional view of an embodiment of a part of a display device.

FIG. 10 shows a cross-sectional view of an embodiment of a part of a display device.

As shown in FIG. 10, the display device may include a substrate 100, a transistor TFT disposed on the substrate 100, a light-emitting device ED connected to the transistor TFT, and an encapsulation layer 400 disposed on the light-emitting device ED. A sensing insulating layer 510, a plurality of sensing electrodes 520 and 540, a second sensing electrode connector 541, a first insulating layer 555, a second insulating layer 560, and a third insulating layer 550 may be disposed on the encapsulation layer 400.

The first insulating layer 555 may overlap the pixel opening 351, the second insulating layer 560 may be disposed on the first insulating layer 555, and the third insulating layer 550 may surround the first insulating layer 555.

In the previous embodiment, the second insulating layer 560 may cover the first insulating layer 555 and the third insulating layer 550, and in the illustrated embodiment of FIG. 10, the second insulating layer 560 may cover the first insulating layer 555 and may not cover the third insulating layer 550. The third insulating layer 550 may cover the second insulating layer 560.

The first insulating layer 555 may be bigger than the pixel opening 351. The first insulating layer 555 may thus overlap an entirety of the pixel opening 351. That is, the first insulating layer 555 may entirely cover the pixel opening 351.

The width Win2 of the second insulating layer 560 may be greater than the width Win1 of the first insulating layer 555. The thickness T2 of the second insulating layer 560 may be greater than the thickness T1 of the first insulating layer 555. The second insulating layer 560 may cover the upper side and the lateral side of the first insulating layer 555. That is, the second insulating layer 560 may cover an entirety of the first insulating layer 555. Hence, the second insulating layer 560 may overlap an entirety of the pixel opening 351. That is, the second insulating layer 560 may cover an entirety of the pixel opening 351.

The third insulating layer 550 may be disposed on an entirety of the substrate 100. The thickness T3 of the third insulating layer 550 may be greater than the thickness T2 of the second insulating layer 560. The third insulating layer 550 may cover the upper side and the lateral side of the second insulating layer 560. That is, the third insulating layer 550 may cover an entirety of the second insulating layer 560.

The first insulating layer 555, the second insulating layer 560, and the third insulating layer 550 have different refractive indices. The refractive index of the first insulating layer 555 may be greater than the refractive index of the second insulating layer 560, and the refractive index of the second insulating layer 560 may be greater than the refractive index of the third insulating layer 550.

The display device in an embodiment includes the first insulating layer 555, the second insulating layer 560, and the third insulating layer 550 having different refractive indices from one another, thereby increasing visibility at the front and light-outputting efficiency of the display device. A path of light generated by a display device in an embodiment will now be described with reference to FIG. 11.

Figure 11:
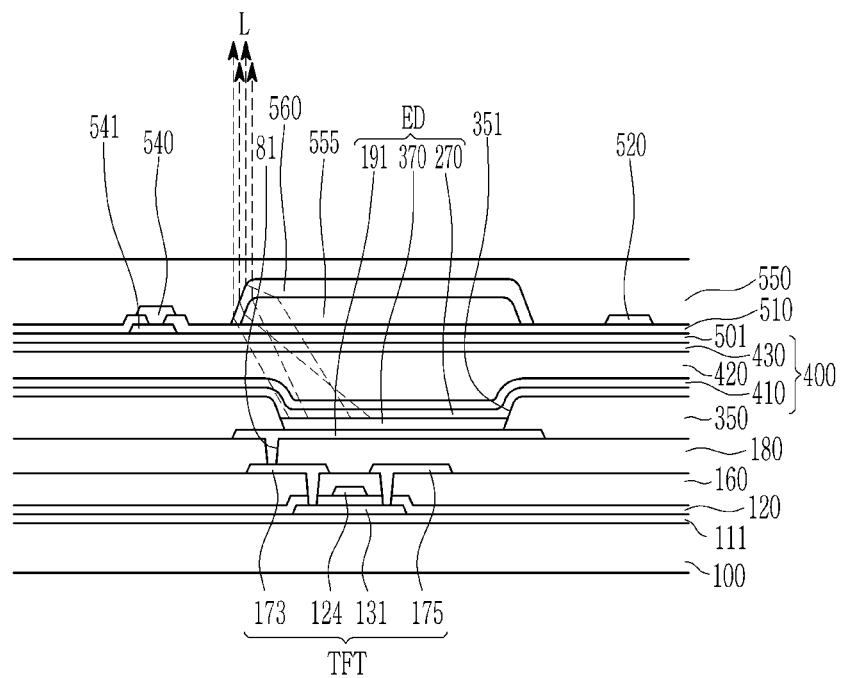
FIG. 11 shows an embodiment of a path of light generated by a light-emitting device of a display device.

FIG. 11 shows an embodiment of a path of light generated by a light-emitting device of a display device.

As shown in FIG. 11, the light L generated by the light-emitting device ED may pass through the first insulating layer 555, the second insulating layer 560, and the third insulating layer 550 and may be output to the front. That is, the light L may be discharged in a direction that is perpendicular to the substrate 100. Some of the light L generated by the light-emitting device ED may progress in an oblique direction to the substrate 100, may be reflected at the cover window, and may be returned. In an embodiment of the display device, the light L generated by the light-emitting device ED may be refracted at an interface between the first insulating layer 555 and the second insulating layer 560. Some of the light refracted while passing through a lateral side of the first insulating layer 555 may pass through the second insulating layer 560 and the third insulating layer 550 and may be output to the front. Some of the light refracted while passing through the lateral side of the first insulating layer 555 may be refracted at the interface between the second insulating layer 560 and the third insulating layer 550 and may be output to the front. The light that does not pass through the first insulating layer 555 but is input to the second insulating layer 560 may be refracted at the interface between the second insulating layer 560 and the third insulating layer 550 and may be output to the front. Some of the light that passes through the upper side of the first insulating layer 555 and is refracted may be refracted at the interface between the second insulating layer 560 and the third insulating layer 550. Some of the light that passes through the upper side of the first insulating layer 555 and is refracted may be refracted at the interface between the second insulating layer 560 and the third insulating layer 550 and may be output to the front.

A display device in an embodiment will now be described with reference to FIG. 12.

The display device in an embodiment shown in FIG. 12 mostly corresponds to the display device in an embodiment described with reference to FIG. 10 and FIG. 11, so a description regarding the same portions will be omitted. The sensing insulating layer and the first insulating layer are disposed in the same layer in the illustrated embodiment of FIG. 12, which is different from the above-described embodiment, and which will now be described.

Figure 12:
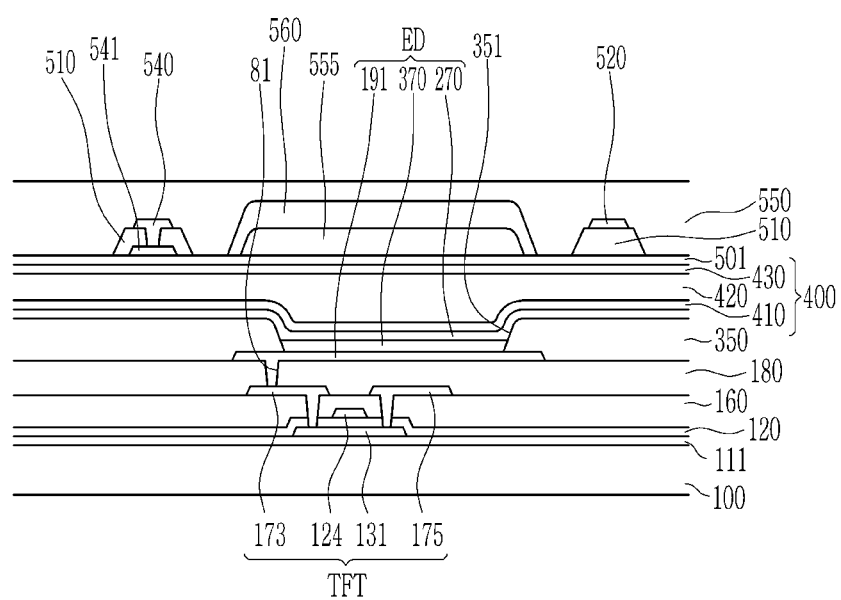
FIG. 12 shows a cross-sectional view of an embodiment of a part of a display device.

FIG. 12 shows a cross-sectional view of an embodiment of a part of a display device.

As shown in FIG. 12, the display device may include a substrate 100, a transistor TFT disposed on the substrate 100, a light-emitting device ED connected to the transistor TFT, and an encapsulation layer 400 disposed on the light-emitting device ED. A sensing insulating layer 510, a plurality of sensing electrodes 520 and 540, a second sensing electrode connector 541, a first insulating layer 555, a second insulating layer 560, and a third insulating layer 550 may be disposed on the encapsulation layer 400.

The first insulating layer 555 may overlap the pixel opening 351, the second insulating layer 560 may be disposed on the first insulating layer 555, and the third insulating layer 550 may be disposed on the second insulating layer 560.

The first insulating layer 555 may be disposed on the sensing insulating layer 510 in the previous embodiment, and the first insulating layer 555 may be disposed in the same layer as the sensing insulating layer 510 in the illustrated embodiment of FIG. 12.

The sensing insulating layer 510 may be disposed on the second sensing electrode connector 541, and the sensing electrodes 520 and 540 may be disposed on the sensing insulating layer 510. The sensing insulating layer 510 may be disposed between the sensing electrodes 520 and 540 and the second sensing electrode connector 541. An opening overlapping the second sensing electrode 540 and the second sensing electrode connector 541 may be defined in the sensing insulating layer 510, and the second sensing electrode 540 may be connected to the second sensing electrode connector 541 through the opening.

The first insulating layer 555 may include the same material as that of the sensing insulating layer 510, and may be disposed in the same layer as the sensing insulating layer 510. The first insulating layer 555 and the sensing insulating layer 510 may be made by the same process, and may substantially have the same thickness. Therefore, the process may be further simplified and the cost may be reduced.

The first insulating layer 555, the second insulating layer 560, and the third insulating layer 550 have different refractive indices. The refractive index of the first insulating layer 555 may be greater than the refractive index of the second insulating layer 560, and the refractive index of the second insulating layer 560 may be greater than the refractive index of the third insulating layer 550. The display device in an embodiment includes the first insulating layer 555, the second insulating layer 560, and the third insulating layer 550 having different refractive indices from one another, thereby increasing visibility at the front and light-outputting efficiency of the display device.

While this invention has been described in connection with what is presently considered to be practical embodiments, it is to be understood that the invention is not limited to the disclosed embodiments, but, on the contrary, is intended to cover various modifications and equivalent arrangements included within the spirit and scope of the appended claims.

What is claimed is:

1. A display device comprising:
a substrate;
a transistor disposed on the substrate;
a pixel electrode connected to the transistor;
a bank layer disposed on the pixel electrode and defining a pixel opening overlapping the pixel electrode;
an emission layer disposed in the pixel opening;
a common electrode disposed on the emission layer and the bank layer;
an encapsulation layer disposed on the common electrode;
a sensing electrode disposed on the encapsulation layer;
a first insulating layer disposed on the encapsulation layer and overlapping the pixel opening;
a second insulating layer disposed on the first insulating layer; and
a third insulating layer surrounding the first insulating layer,
wherein a refractive index of the first insulating layer, a refractive index of the second insulating layer, and a refractive index of the third insulating layer are different from one another,
the refractive index of the first insulating layer is greater than the refractive index of the third insulating layer, and
a maximum thickness of the third insulating layer is greater than a maximum thickness of the first insulating layer in a direction perpendicular to a main plane extension direction of the substrate so that a maximum height of the third insulating layer from the substrate is greater than a maximum height of the first insulating layer from the substrate.

2. The display device of claim 1, wherein
the refractive index of the second insulating layer is less than the refractive index of the first insulating layer and is greater than the refractive index of the third insulating layer.

3. The display device of claim 2, wherein
an opening is defined in the third insulating layer, the first insulating layer is disposed in the opening of the third insulating layer, and
the second insulating layer covers the first insulating layer and the third insulating layer.

4. The display device of claim 3, wherein
a width of the opening of the third insulating layer corresponds to a width of the first insulating layer, and
an end portion of the first insulating layer contacts an end portion of the third insulating layer.

5. The display device of claim 3, wherein
a width of the opening of the third insulating layer is greater than a width of the first insulating layer, and
the first insulating layer is spaced apart from the third insulating layer.

6. The display device of claim 3, wherein
a width of the opening of the third insulating layer is greater than a width of the first insulating layer, and
the third insulating layer covers a lateral side of the first insulating layer.

7. The display device of claim 3, wherein
the sensing electrode is covered by the third insulating layer.

8. The display device of claim 7, further comprising:
a sensing electrode connector connected to the sensing electrode; and
a sensing insulating layer disposed between the sensing electrode and the sensing electrode connector.

9. The display device of claim 3, wherein
the sensing electrode is disposed on the third insulating layer.

10. The display device of claim 9, further comprising
a sensing electrode connector connected to the sensing electrode,
wherein the third insulating layer is disposed between the sensing electrode and the sensing electrode connector.

11. The display device of claim 2, wherein
the second insulating layer covers the first insulating layer, and
the third insulating layer covers the second insulating layer.

12. The display device of claim 11, wherein
the second insulating layer covers an upper side and a lateral side of the first insulating layer, and
the third insulating layer covers an upper side and a lateral side of the second insulating layer.

13. The display device of claim 11, wherein
a width of the second insulating layer is greater than a width of the first insulating layer, and
the third insulating layer is disposed on an entirety of the substrate.

14. The display device of claim 11, wherein
a thickness of the second insulating layer is greater than the maximum thickness of the first insulating layer, and
the maximum thickness of the third insulating layer is greater than the thickness of the second insulating layer.

15. The display device of claim 11, further comprising:
a sensing electrode connector connected to the sensing electrode; and
a sensing insulating layer disposed between the sensing electrode and the sensing electrode connector,
wherein the first insulating layer is disposed on the sensing insulating layer.

16. The display device of claim 11, further comprising:
a sensing electrode connector connected to the sensing electrode; and a sensing insulating layer disposed between the sensing electrode and the sensing electrode connector, wherein the first insulating layer includes a same material as a material of the sensing insulating layer and is disposed in a same layer.

17. The display device of claim 2, wherein a difference between a refractive index of the first insulating layer and a refractive index of the second insulating layer is equal to or greater than about 0.01 and is equal to or less than about 0.67.

18. The display device of claim 17, wherein a difference between a refractive index of the second insulating layer and a refractive index of the third insulating layer is equal to or greater than about 0.01 and is equal to or less than about 0.67.

19. The display device of claim 18, wherein the difference between the refractive index of the first insulating layer and the refractive index of the second insulating layer is equal to or greater than about 0.05, and the difference between the refractive index of the second insulating layer and the refractive index of the third insulating layer is equal to or greater than about 0.05.

\* \* \* \* \*